United States Patent [19]
Lee

[11] Patent Number: 5,532,967
[45] Date of Patent: Jul. 2, 1996

[54] METHOD FOR SUPPRESSING PEAK CURRENT IN A VIDEO RAM AND IN A SERIAL ACCESS MEMORY BLOCK

[75] Inventor: Jung-Hyuck Lee, Seoul, Rep. of Korea

[73] Assignee: Samsung Electronics Co., Ltd., Suwon, Rep. of Korea

[21] Appl. No.: 352,735

[22] Filed: Dec. 2, 1994

[30] Foreign Application Priority Data

Dec. 2, 1993 [KR] Rep. of Korea .................. 26144/1993

[51] Int. Cl.$^6$ .................................................. G11C 7/02
[52] U.S. Cl. ........................................... 365/206; 365/226
[58] Field of Search ..................................... 365/206, 226

[56] References Cited

U.S. PATENT DOCUMENTS

| | | | |
|---|---|---|---|
| 4,400,802 | 8/1983 | Rydval | 365/226 |
| 4,733,375 | 3/1988 | Terashima | 365/206 |
| 5,280,453 | 1/1994 | Miyawaki et al. | 365/206 |

*Primary Examiner*—Joseph A. Popek

[57] ABSTRACT

A video RAM capable of minimizing the peak current generated during a data transfer operation performed between a RAM and a SAM, and a method for suppressing the peak current in a SAM block. The video RAM comprises a first power source, a second power source, unit latch circuit which inputs the first and second power sources as a source power, a SAM block composed of a plurality of unit latch circuits, and peak current suppression means formed on a path through which the first and second power sources are inputted to the unit latch circuit.

14 Claims, 3 Drawing Sheets

METHOD FOR SUPPRESSING PEAK CURRENT IN A VIDEO RAM AND IN A SERIAL ACCESS MEMORY BLOCK

BACKGROUND OF THE INVENTION

The present invention relates to a video random access memory (video RAM) used as a dual port memory. More particularly, the present invention relates to the video RAM which suppresses peak current during data transfer operations performed between a random access memory and a serial access memory. The present invention further relates to a method for suppressing the peak current in a serial access memory block.

Recently, with the rapid spread of portable computers such as notebook computers, video RAM technology has become an important and evolving field. A video RAM used as a dual port memory functions as both a dynamic random access memory (DRAM) and as serial access memory (SAM). The typical video RAM has a DRAM port connected to a CPU in the overall computer system, and the SAM port connected to a peripheral device, such as a cathode ray tube (CRT), a liquid crystal diplay (LCD), or a video camera. The SAM port and RAM port operate independently, but may cooperate to transfer data.

SAMs have a wide variety of applications for various systems. SAMs are characterized by asynchronous operation, and very high data transfer speeds. Conventional video RAMs may contain either a full SAM or a half SAM. For example, the NEC video RAM identified as µPD482445 employs a full SAM, while the Texas Instruments video RAM identified as TMS55160 employs a half SAM. However, in either configuration, the increasing variety of operational functions required of video RAMs require video RAMs having higher data storage capacity. This requirement necessitates increased integration density in video RAMs.

FIG. 1 is illustrative of the conventional video RAM. Further details of the conventional video RAM can be obtained from published technical articles such as the 1985 ISSCC paper "A 256K Dual Port Memory." In FIG. 1, the construction and operation of the RAM port are the same as those used in conventional DRAMs. As shown, a plurality of sense amplifiers 4 amplify data signals to and from a memory cell array 6. A dotted line block 10 indicates a SAM block, often referred to as a data register block, having a plurality of latch circuits. Each latch circuit comprises two inverters having input and output terminals oppositely connected to bit lines BL and BL/. Data transfer gates consisting of NMOS transistors T1, T2, . . . , Tn are formed on the bit lines BL and BL/ and connect SAM block 10 with memory cell array 6. Each data transfer gate receives a data transfer gate enable signal DTP.

In the illustrative video RAM, the SAM block is typically 512×4, 512K×8, or 512K×16, etc. The 512K×4 size SAM is usually associated with a 1M video RAM, where $M=2^{20}$, the 512K×8 size SAM with a 2M video RAM, and the 512×16 size SAM with the 4M video RAM. Operation of the SAM block via the SAM port is typically performed after data is transferred through data transfer gates T1, T2, . . . , Tn. That is, SAM block 10, whether having a 512K×4, 512K×8, or 512K×16 size, is enabled all at once. Thereafter, data is transferred.

Increasing block size correspondingly increases the amount of data transferred. At contemporary block sizes and given the corresponding quantity of data transferred, a problem has arisen in the level of peak current through the power and ground voltage terminals of the latch circuits of SAM block 10. Since the level of peak current generated is proportional to the density of the semiconductor memory device, the problem will only become more serious as memory device densities continue to increase.

Increased peak current brings with it increased noise on the the ground and power terminals of the the latch circuits. This increased noise level destabilizes the logic threshold voltage VT of transistors in the memory device, thus leading to device malfunction. The noise generated by increased peak current can additionally cause the operating voltage potential for data transferred to the SAM block to reversed from a defined potential, thereby reducing reliability in the video RAM.

SUMMARY OF THE INVENTION

In view of the foregoing, it is an object of the present invention to provide a video RAM capable of ensuring reliability by minimizing the amount of a peak current which can be generated during a data transfer operation.

It is another object of the present invention to provide a video RAM which increases a SAM block and contrary generates minimally a peak current.

It is still another object of the present invention to provide a video RAM which enables power and ground voltage terminals to minimally generate noise during transferring data through a SAM block.

It is a further object of the present invention to provide a video RAM which has a SAM block to prevent the voltage level of data from being reversed from a given voltage level during transferring the data through the SAM block.

It is still a further object of the present invention to provide a method for suppressing a peak current in SAM block of a video RAM which enables the power and ground voltage terminals to minimally generate noise according to the peak current during transferring data through a SAM block.

The video RAM according to the objects of the present invention includes a first power source, a second power source, unit latch circuit which receives said first and second power sources as source power, a serial access memory block composed of a plurality of unit latch circuits and peak current suppression means formed on a path through which said first and second power sources are input to said unit latch circuit.

BRIEF DESCRIPTION OF THE DRAWINGS

The above and other objects, advantages and features of the present invention will be more apparent from the following detailed description taken with the attached drawings in which.

DETAILED DESCRIPTION OF THE PREFERRED EMBODIMENT

The following description explains, the inner construction of the video RAM having a peak current suppression device according to the present invention.

Figure 1:
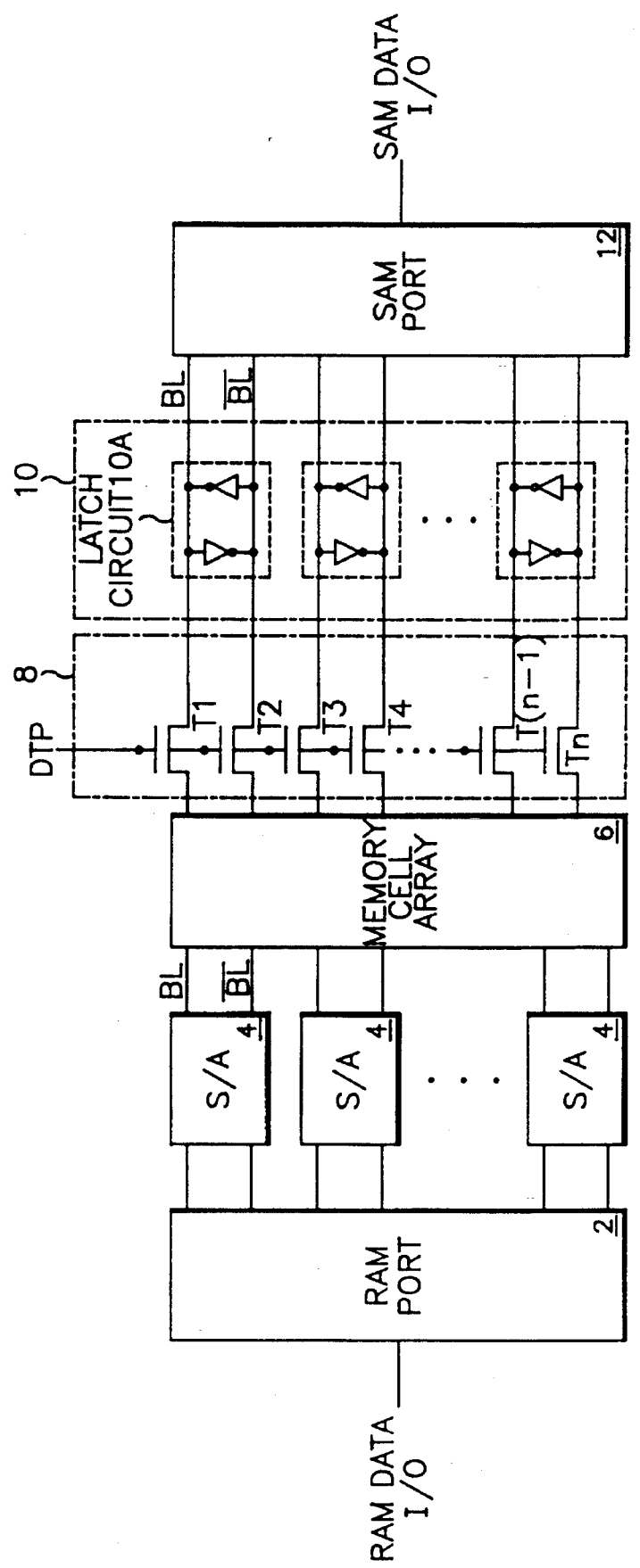
FIG. 1 is a block diagram showing an inner construction of a video RAM according to a conventional art.
Figure 2:
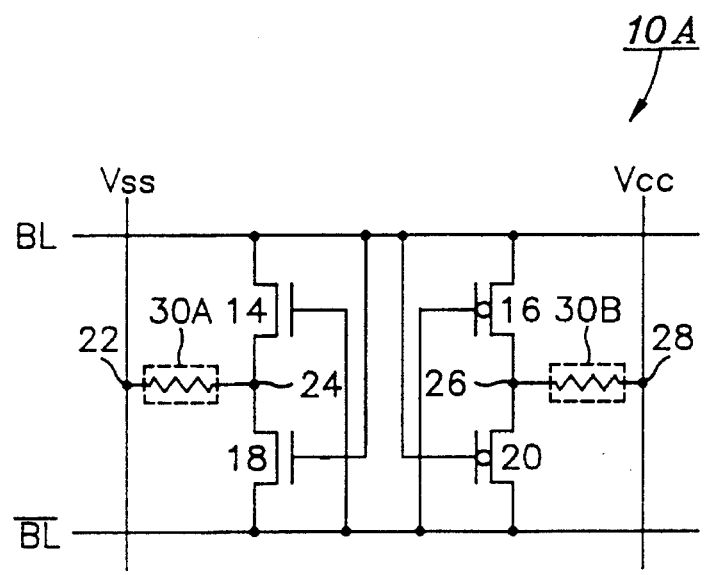
FIG. 2 is a circuit view showing an construction of unit latch circuit having a peak current suppression device according to the present invention.

FIG. 2 is a circuit view showing an embodiment of unit latch circuit 10A having the peak current suppression device according to the present invention. In the construction of unit latch circuit 10A shown in FIG. 2, one inverter is formed by a PMOS transistor 16 and an NMOS transistor 14, and another inverter formed by a PMOS transistor 20 and an NMOS transistor 18, thereby forming one latch circuit. Such a latch circuit is formed on the bit lines BL and BL/. The two inverters have the peak current suppression devices 30A and 30B connected to the power voltage VCC and the ground voltage VSS. In FIG. 2, the peak current suppression devices 30A and 30B form a resistance to suppress the peak current. The resistance can be implemented by a poly-silicon resistance or a diffusion resistance. Moreover, the resistance should be implemented to ensure reliability without having significant influence the variations of temperature and voltage. Meanwhile, as the peak current suppression device, the resistance can be embodied by transistor or impedance elements. Unit latch circuit 10A of FIG. 2 must latch data transferred to the bit lines BL and BL/ during the data transfer operation. Further, reliability should be ensured when the data to be transferred during the data transfer operation is different from previous stored data in the voltage level. In the meanwhile, as the data transfer gates T1, T2, . . . , Tn of FIG. 1 are turned on, unit latch circuit 10A delays generating the current from the power voltage VCC to the ground voltage VSS during the data transfer operation. Then, the consumption of current is the same as that of the circuit shown in FIG. 1. However, in FIG. 2, the peak current generated is to be suppressed in proportion to time passing through the resistances. Further, due to the resistance, it is possible to prevent data from being changed improperly, such as when a large amount of peak current is generated when the polarity of is reversed. It is also possible to suppress the peak current in proportion to the resistance value.

Figure 3:
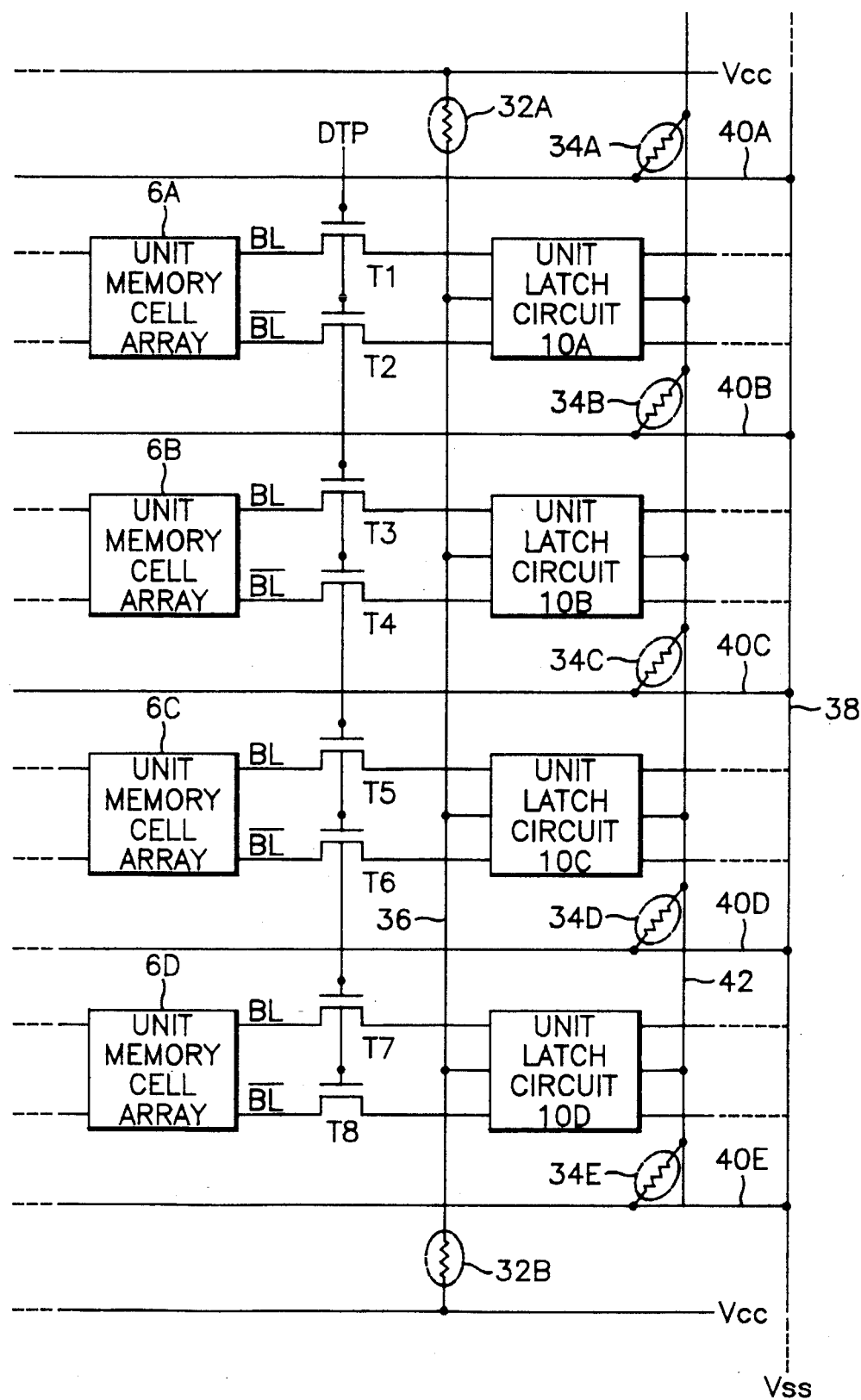
FIG. 3 is a circuit construction view showing a peak current suppression device is installed in a peripheral power line of a latch circuit according to the present invention.

FIG. 3 shows that each of unit latch circuits 10A, 10B, 10C, and 10D forming the SAM block according to the construction of FIG. 1 having only the peak current suppression device as one embodiment of the present invention. As shown in FIG. 3, the peak current suppression device is arranged on a general word line strapping region. Specifically, it is arranged in a region where a lay-out is relatively less dense. In the construction of FIG. 3, power lines provided with the power voltage VCC are each formed in an upper and lower portions of the memory cell array region. A power line 36 is formed to connect the power lines to each other and then provide the power voltage VCC to the unit latch circuits 10A, 10B, 10C, and 10D. Meanwhile, a power line 38 provided with the ground voltage VSS is formed in the peripheral circuit region and power lines 40A, 40B, 40C, 40D, and 40E coupled to the power line 38 are also formed in the strapping region. Furthermore, another power line 42 crossed with the power lines 40A, 40B, 40C, 40D, and 40E is formed and the ground voltage VSS is provided to the unit latch circuits 10A, 10B, 10C, and 10D. The resistances 32A and 32B functioned as the peak current suppression device are installed on the power lines provided with the power voltage VCC and arranged in the peripheral circuit region. Also, the resistances 34A, 34B, 34C, 34D, and 34E are installed on the power lines provided with the ground voltage VSS and arranged in the strapping region. As mentioned above, the peak current suppression device is included in each of the power lines connected to the unit latch circuits 10A, 10B, 10C, and 10D, so that the noise can be minimally generated in the power voltage terminal or the ground voltage terminal according to the variation of the current which can be generated within each of the latch circuits 10A, 10B, 10C, 10D during the data transfer operation.

Figure 4:
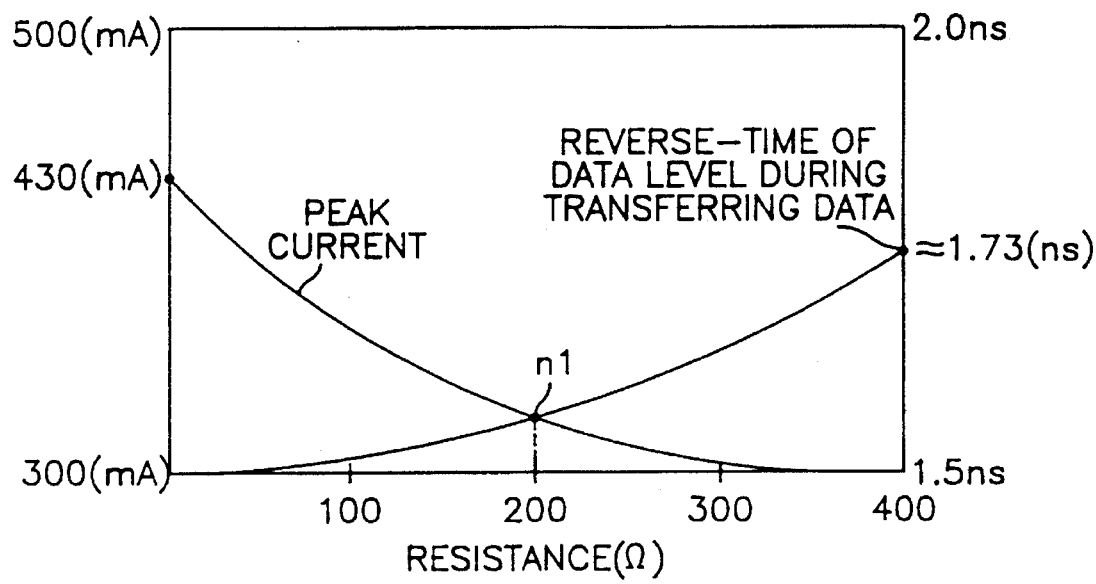
FIG. 4 is waveform showing the relationship between a peak current value according to an impedance value of a peak current suppression device and reverse-time of a data level during a data transfer operation according to the present invention.

FIG. 4 is a graph showing the value of the peak current according to the resistance value, i.e., the impedance value of the peak current suppression device, and the reverse-time of a data level during the data transfer operation, as confirmed by the inventor's simulation based on the construction of FIG. 3. As shown in FIG. 4, the larger the resistance value of the peak current suppression device is, the smaller the value of the peak current is, and the larger the value of the reverse-time of the data level during the data transfer operation. Accordingly, the resistance value should be optimally adequate for both the peak current and the reverse-time of the data level, as shown in FIG. 4, as the node N1 where the two curves intersect. Therefore, it is desirable to select an appropriate resistance value (in FIG. 4, it has 200Ω) for the peak current suppression device according to the present invention.

The video RAM having the SAM block where the peak current suppression device is included, as shown in FIGS. 2 and 3, is the preferred embodiment based on the present invention. Specifically, in case of forming the peak current suppression devices in FIG. 3, it is possible to change the position of the peak current suppression devices. The power and ground voltages shown in FIGS. 2 and 3 are provided with the power source from the outside. However, the power voltage can use the internal power voltage generated in the chip. Furthermore, according to the present a resistance is used as the peak current suppression device, although impedance elements can be also used as the peak current suppression device.

As described above, the video RAM according to the present invention installs the peak current suppression device in the SAM block. Thereby, it is possible to minimize noise which is generated by the peak current in the power and ground voltage lines while transferring data through the SAM block. Also, the invention has the advantage of preventing the voltage level of data from being reversed from the predetermined voltage level during the data transfer operation. Further, although the SAM block size is increased, the peak current can be minimized. Accordingly, this increases the reliability of a high density video RAM device.

What is claimed is:

1. A video random access memory comprising a first power source, a second power source, a plurality of unit circuits coupled to said first and second power sources, said unit latch circuits arranged in a serial access memory block, and a plurality of peak current suppression circuits connected between said first and second power sources and said unit latch circuits.

2. A video random access memory as in claim 1, wherein said first power source is a power voltage and said second power source is a ground voltage.

3. A video random access memory as in claim 2, wherein each said peak current suppression circuit is a resistor.

4. A video random access memory as claimed in claim 2, wherein each said first and second peak current suppression circuit comprises an inductor.

5. A video random access memory having a cell array region; a peripheral circuit region; a plurality of unit memory cell arrays formed on said cell array region; a pair of bit lines arranged on said cell array region and connected to said plurality of unit memory cell arrays; a serial access memory block formed on said cell array region, said serial access memory block comprising a plurality of unit latch circuits connected to said bit lines and performing a one-to-one data transfer operation with said plurality of unit memory cell arrays; and said data transfer gates formed on said cell array region and arranged in each said bit line between each said unit memory cell array and each said unit latch circuit, comprising:

- a first power voltage line formed on said peripheral circuit region, provided with a power voltage and arranged substantially parallel to said serial access memory block;
- a second power voltage line formed on said peripheral circuit region, provided with said power voltage, and arranged substantially parallel to said first power voltage line, with said SAM block positioned therebetween;
- a third power voltage line formed on said cell array region, positioned substantially perpendicular to said first and second power voltage lines, and providing said power voltage to each of said unit latch circuits;
- first peak current suppression circuits formed in said peripheral circuit region between said first power voltage line and said third power voltage line and between said second power voltage line and said third power voltage line;
- a first ground voltage line formed on said peripheral region and provided with a ground voltage;
- a plurality of second ground voltage lines formed in said cell array region substantially perpendicular to and connected to said first ground voltage line;
- a third ground voltage line formed on said cell array region substantially parallel to said first ground voltage line, coupled to each of said unit latch circuits; and,
- a plurality of second peak current suppression circuits formed between said third ground voltage line and each said second ground voltage power line.

6. A video random access memory as claimed in claim 5, each said first and second peak current suppression circuit comprises a resistor.

7. A video random access memory as claimed in claim 5, wherein each said first and second peak current suppression circuit comprises an inductor.

8. A semiconductor memory comprising:

- a plurality of unit memory cell arrays;
- a plurality of unit latch circuits, each said unit latch circuit coupled to a corresponding said unit memory cell array via a pair of bit lines;
- a voltage power bus for supplying a power voltage;
- a ground power bus for supplying a ground voltage;
- a unit latch voltage power bus coupled to said unit latch circuits, and coupled to said voltage power bus through at least one first peak current suppression circuit; and
- a unit latch ground power bus coupled to said unit latch circuits, and coupled to said ground power bus through at least one second peak current suppression circuit.

9. A semiconductor memory device as in claim 8, wherein said voltage power bus and said ground power bus are formed in a peripheral region, and said unit latch voltage power bus and said unit latch ground power bus are formed in a cell array region.

10. A semiconductor memory device as in claim 9, wherein said first and second peak current suppression circuits are formed in said peripheral region.

11. A semiconductor memory device as in claim 10, wherein a major portion of said unit latch power bus is substantially perpendicular to a major portion of said voltage power bus, and a major portion of said unit latch ground bus is substantially perpendicular to a major portion of said ground power bus.

12. A semiconductor memory device as in claim 11, wherein said major portion of said voltage power bus is substantially perpendicular to said major portion of said ground power bus.

13. A semiconductor memory device as in claim 10, wherein said first and second peak current suppression circuits are resistors.

14. A semiconductor memory device as in claim 10, wherein said first and second peak current suppression circuits are inductors.

* * * * *